(12) United States Patent
Yanagisawa et al.

(10) Patent No.: US 6,830,946 B2
(45) Date of Patent: Dec. 14, 2004

(54) DEVICE TRANSFER METHOD AND PANEL

(75) Inventors: Yoshiyuki Yanagisawa, Kanagawa (JP); Toyoharu Oohata, Kanagawa (JP); Toshiaki Iwafuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/062,776

(22) Filed: Jan. 30, 2002

(65) Prior Publication Data

US 2002/0153832 A1 Oct. 24, 2002

(30) Foreign Application Priority Data

Feb. 1, 2001 (JP) .................................... P2001-025114

(51) Int. Cl.⁷ .............................................. H01L 21/44
(52) U.S. Cl. .................... 438/26; 438/106; 438/110; 438/458; 438/464
(58) Field of Search ........................... 438/22, 24, 25, 438/26, 28, 34, 38, 106, 107, 108, 110, 112, 113, 114, 127, 455–465, 33

(56) References Cited

U.S. PATENT DOCUMENTS

| | | | |
|---|---|---|---|
| 5,177,405 A | | 1/1993 | Kusuda et al. |
| 5,206,749 A | | 4/1993 | Zavracky et al. |
| 5,258,320 A | | 11/1993 | Zavracky et al. |
| 5,438,241 A | | 8/1995 | Zavracky et al. |
| 5,593,917 A | * | 1/1997 | Nuyen ........................ 438/28 |
| 5,739,800 A | | 4/1998 | Lebby et al. |
| 5,766,695 A | * | 6/1998 | Nguyen et al. ............. 427/553 |
| 5,981,977 A | | 11/1999 | Furukawa et al. |
| 6,113,685 A | * | 9/2000 | Wang et al. ..................... 117/3 |
| 6,274,518 B1 | * | 8/2001 | Yuri et al. ................... 438/791 |
| 6,287,891 B1 | * | 9/2001 | Sayyah ....................... 438/106 |
| 6,303,405 B1 | * | 10/2001 | Ysoshida et al. ............. 438/46 |
| 6,413,838 B2 | * | 7/2002 | Itoh ........................... 438/462 |
| 6,420,242 B1 | * | 7/2002 | Cheung et al. ............. 438/458 |
| 6,425,971 B1 | * | 7/2002 | Silverbrook ................ 438/106 |
| 6,613,610 B2 | * | 9/2003 | Iwafuchi et al. ............ 438/128 |
| 6,656,819 B1 | * | 12/2003 | Sugino et al. .............. 438/460 |
| 6,683,416 B1 | * | 1/2004 | Oohata et al. ........... 315/169.3 |
| 2002/0048905 A1 | * | 4/2002 | Ikegami et al. ............. 438/464 |
| 2002/0078559 A1 | * | 6/2002 | Buchalter et al. ............. 29/832 |
| 2002/0115265 A1 | * | 8/2002 | Iwafuchi ..................... 438/458 |
| 2002/0137342 A1 | * | 9/2002 | Ishida et al. ................ 438/689 |
| 2003/0087476 A1 | * | 5/2003 | Oohata et al. .............. 438/108 |

FOREIGN PATENT DOCUMENTS

| | | |
|---|---|---|
| EP | 0 905 673 A1 | 3/1999 |
| JP | 56-17385 | 2/1981 |
| JP | 56-92577 | 7/1981 |

(List continued on next page.)

OTHER PUBLICATIONS

Kelly et al, "Optical patterning of GaN films" Appl Phy Lett vol. 69 Sep. 16, 1996.*

(List continued on next page.)

*Primary Examiner*—Savitri Mulpuri
(74) *Attorney, Agent, or Firm*—Bell, Boyd & Lloyd LLC

(57) ABSTRACT

A device transfer method includes the steps of: covering a plurality of devices, which have been formed on a substrate, with a resin layer; forming electrodes in the resin layer in such a manner that the electrodes are connected to the devices; cutting the resin layer, to obtain resin buried devices each containing at least one of the devices; and peeling the resin buried devices from the substrate and transferring them to a device transfer body. This device transfer method is advantageous in easily, smoothly separating devices from each other, and facilitating handling of the devices in a transfer step and ensuring good electric connection between the devices and external wiring, even if the devices are fine devices.

8 Claims, 12 Drawing Sheets

FOREIGN PATENT DOCUMENTS

| | | |
|---|---|---|
| JP | 57-45583 | 3/1982 |
| JP | 57-52071 | 3/1982 |
| JP | 57-52072 | 3/1982 |
| JP | 57-52073 | 3/1982 |
| JP | 58-50577 | 3/1983 |
| JP | 60-181778 | 9/1985 |
| JP | 61-156780 | 7/1986 |
| JP | 63-188938 | 8/1988 |
| JP | 02-114196 | 4/1990 |
| JP | 2-263668 | 10/1990 |
| JP | 03-035568 | 2/1991 |
| JP | 04-010671 | 1/1992 |
| JP | 04-247486 | 9/1992 |
| JP | 05-013659 | 1/1993 |
| JP | 05-290669 | 11/1993 |
| JP | 05-315643 | 11/1993 |
| JP | 5-315646 | 11/1993 |
| JP | 6-45648 | 2/1994 |
| JP | 06-067044 | 3/1994 |
| JP | 06-504139 | 5/1994 |
| JP | 07-110660 | 4/1995 |
| JP | 07-199829 | 4/1995 |
| JP | 07-263754 | 10/1995 |
| JP | 07-321469 | 12/1995 |
| JP | 08-008217 | 1/1996 |
| JP | 08-107293 | 4/1996 |
| JP | 08-264841 | 10/1996 |
| JP | 9-129974 | 5/1997 |
| JP | 09-293904 | 11/1997 |
| JP | 10-070151 | 3/1998 |
| JP | 10-125929 | 5/1998 |
| JP | 10-163536 | 6/1998 |
| JP | 10-173305 | 6/1998 |
| JP | 10-223833 | 8/1998 |
| JP | 10-256694 | 9/1998 |
| JP | 10-270801 | 10/1998 |
| JP | 10-305620 | 11/1998 |
| JP | 10-312971 | 11/1998 |
| JP | 11-26883 | 1/1999 |
| JP | 11-008338 | 1/1999 |
| JP | 11-045977 | 2/1999 |
| JP | 11-075019 | 3/1999 |
| JP | 11-126037 | 5/1999 |
| JP | 11-142878 | 5/1999 |
| JP | 411142878 * | 5/1999 |
| JP | 11-177138 | 7/1999 |
| JP | 11-219146 | 8/1999 |
| JP | 11-251253 | 9/1999 |
| JP | 11-312840 | 11/1999 |
| JP | 11-514136 | 11/1999 |
| JP | 11-346004 | 12/1999 |
| JP | 2000-89693 | 3/2000 |
| JP | 2000-068593 | 3/2000 |
| JP | 2000-183451 | 6/2000 |
| JP | 2000-223417 | 8/2000 |
| JP | 2000-332343 | 11/2000 |
| JP | 2001-085738 | 3/2001 |
| JP | 2001-217503 | 8/2001 |
| JP | 2002-185660 | 12/2002 |
| WO | WO 95-05623 | 2/1995 |
| WO | WO 97-44612 | 11/1997 |

OTHER PUBLICATIONS

Wong et al, "Damage free separation of GaN thin films from sapphire subsatrte", Appl Phys Lett vol. 72 Feb. 2, 1998.*

Zheleva et al., *Pendeo/epitaxy—a new approach for lateral growth of gallium nitride structures*, MRS Internet J. Nitride Semicond. Res. 4S1, G3.38 (1999).

Kapolnek et al., *Spatial control of InGaN luminescence by MOCVD selective epitaxy*, Journal of Crystal Growth, 189/190 (1998) pp. 83/86.

Applied Physics Letters, vol. 76, No. 22, May 29, 2000, "*Selective growth of InGaN quantum dot structures and their microphotoluminescence at room temperature*", Tachibani et al, pp. 3212/3214.

* cited by examiner

F I G. 1A
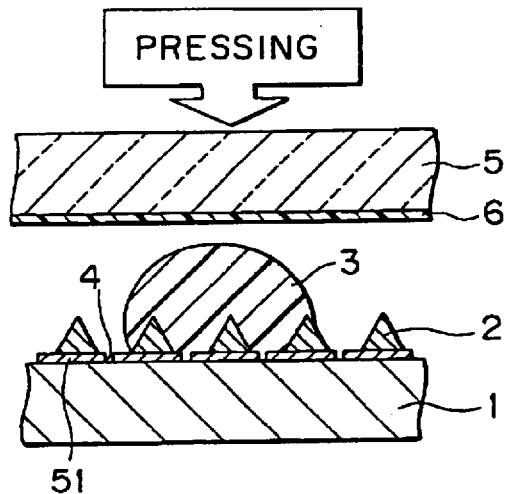
F I G. 1B
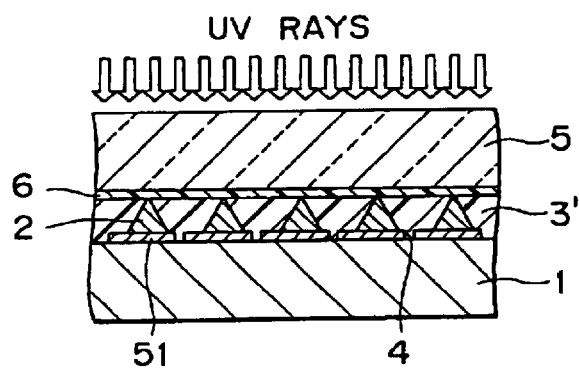
F I G. 1C
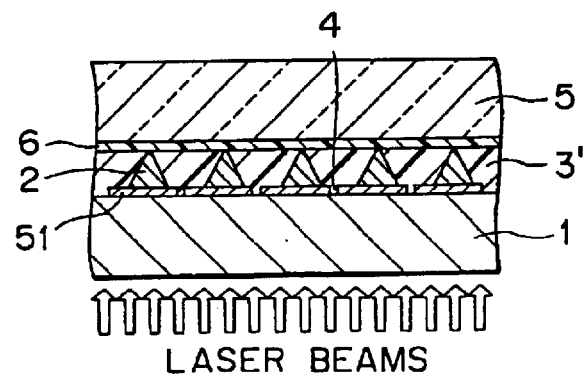

O₂ PLASMA

F I G. 4A
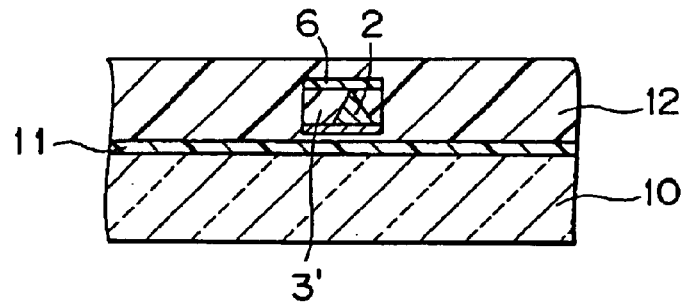
F I G. 4B
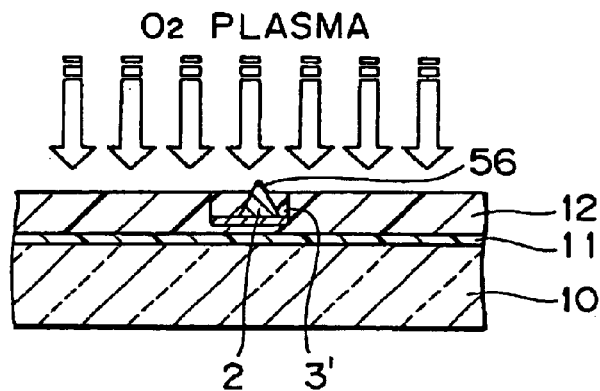
F I G. 4C
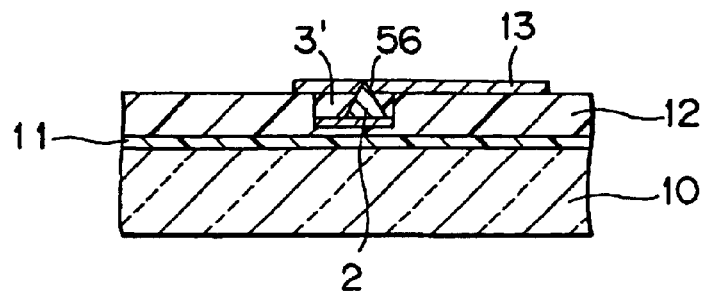

F I G. 5A
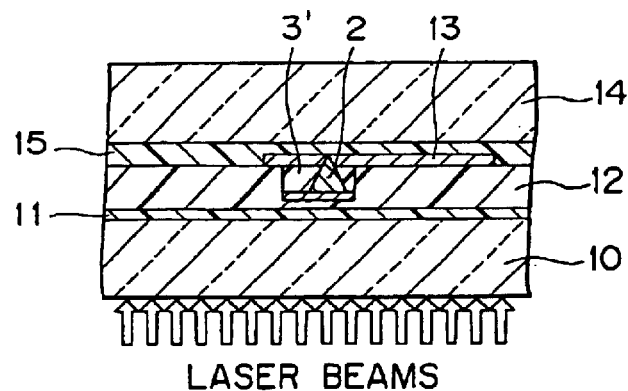
LASER BEAMS
F I G. 5B
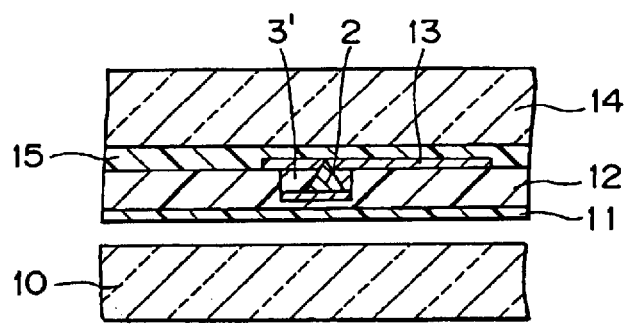
F I G. 5C
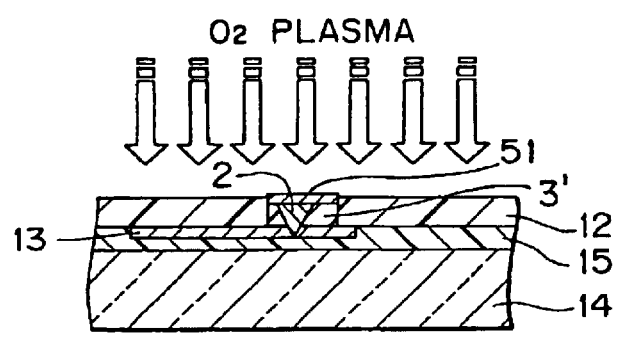

F I G. 6A
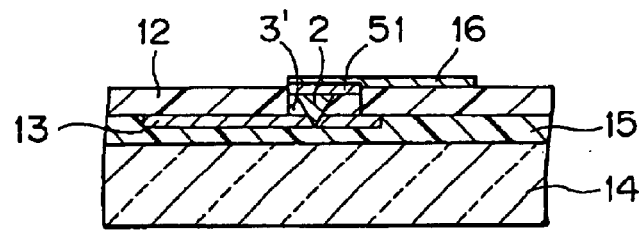
F I G. 6B
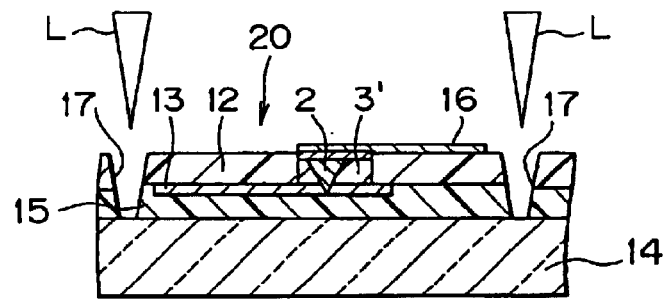
F I G. 6C
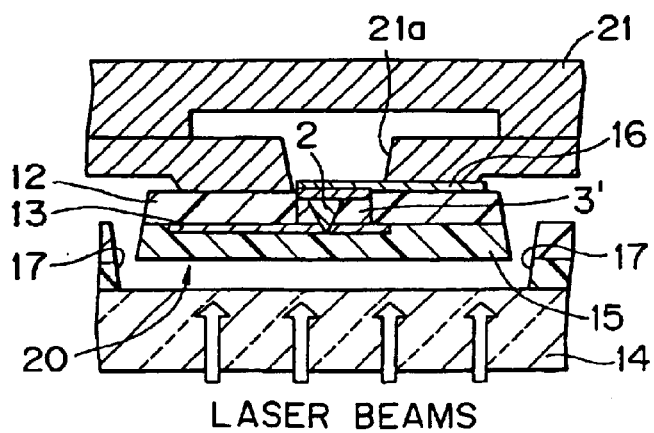

F I G. 9A
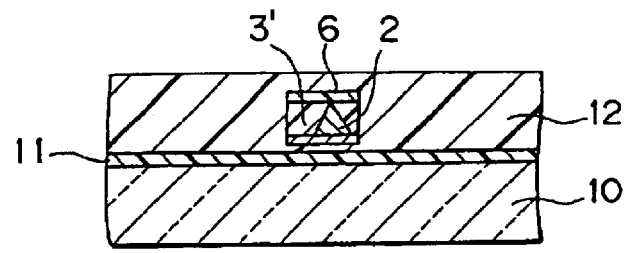
F I G. 9B
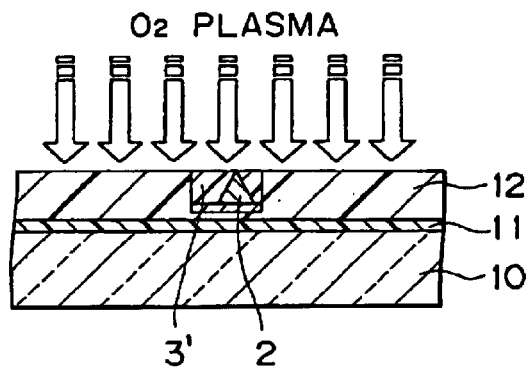
F I G. 9C
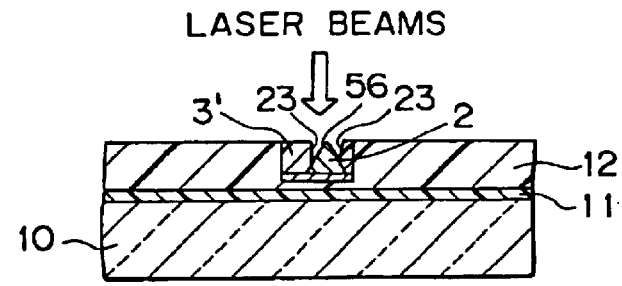
F I G. 9D
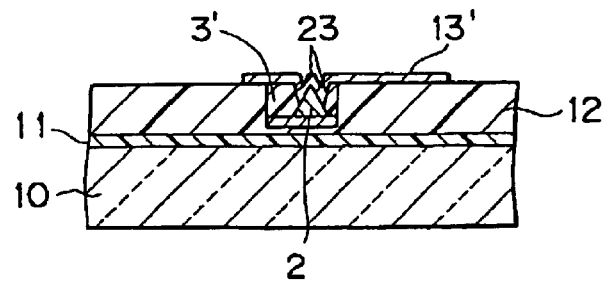

F I G. 11A
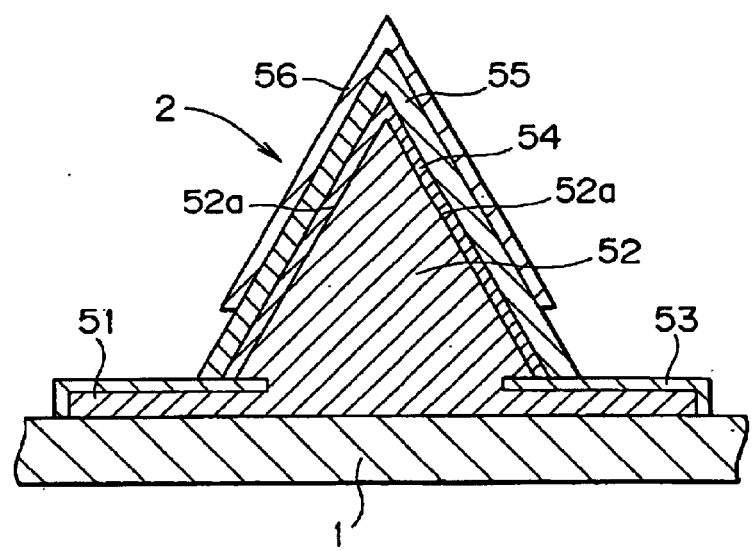
F I G. 11B
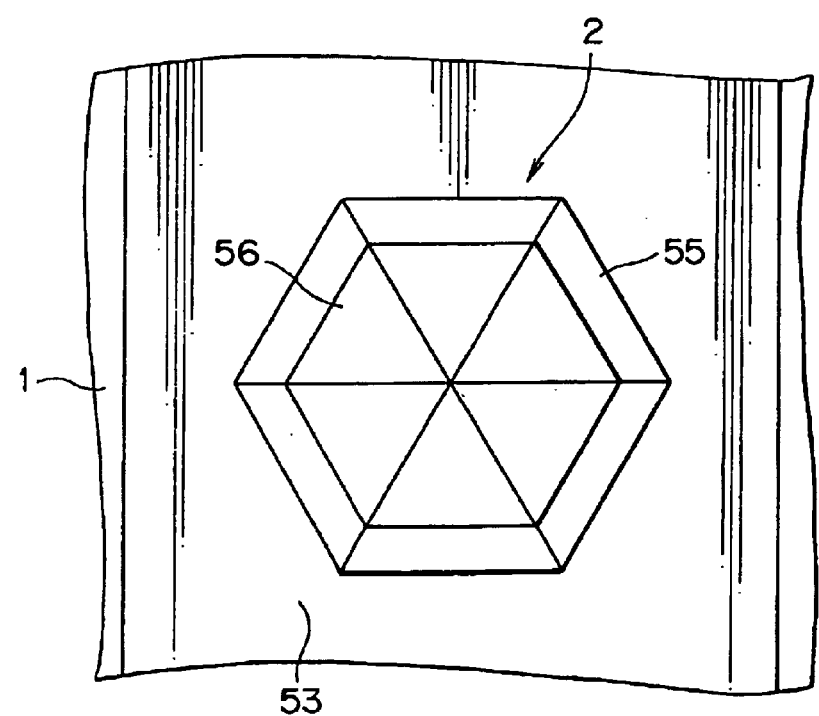

DEVICE TRANSFER METHOD AND PANEL

BACKGROUND OF THE INVENTION

The present invention relates to a device transfer method of transferring light emitting devices such as light emitting diodes, which have been formed on a substrate, for example, a sapphire substrate, to a device transfer body such as a display panel, and to a panel on which the transferred devices are arrayed.

A known method of producing an LED (Light Emitting Diode) display using LEDs includes the steps of cutting an LED wafer, which is obtained by stacking semiconductor layers on a device formation substrate, into chips by a diamond blade or the like, and transferring the LED chips to a display panel or the like with a pitch larger than an array pitch of the LED chips on the device formation substrate.

The above-described cutting method, however, has problems. For example, blue light emitting diodes are produced by stacking gallium nitride based semiconductor layers on a sapphire substrate as a device formation substrate. In this case, sapphire used as the material of the substrate is as very hard, about 9 in Mohs' hardness. As a result, if the sapphire substrate is full cut into chips by a dicer such as a diamond blade, problems such as cracking and/or chipping tend to occur in the cut planes of the sapphire substrate which prevent the sapphire substrate from being smoothly cut into chips of desired shapes and sizes, the dicer itself may also be broken, and that since sapphire has no cleavage characteristic, it is difficult to cut the sapphire substrate into chips by forming scribing lines on the sapphire substrate and forcibly cutting the sapphire substrate along the scribing lines by an external force.

To solve the above problems, a method of cutting a sapphire substrate has been disclosed, for example, in Japanese Patent Laid-open No. Hei 5-315646. According to this method, as shown in FIG. 12, a gallium nitride semiconductor layer 61 formed on a sapphire substrate 60 is cut by a dicer to form grooves 62 deeper than a thickness of the gallium nitride semiconductor layer 61. The sapphire substrate 60 is thinned by polishing a back surface of the sapphire substrate 60. Scribing lines 63 are formed on the sapphire substrate 60 via the grooves 62 by a scriber. The sapphire substrate 60 is then forcibly cut into chips by an external force. This document describes how the sapphire substrate can be smoothly cut into chips without occurrence of cracking and/or chipping in the cut planes of the sapphire substrate 50. However, such a cutting method, requires several steps including the labor intensive step of polishing the sapphire substrate 60. In other words, the above method of cutting a sapphire substrate 60 is expensive and time consuming.

If a larger number of LED devices are obtained from one device formation substrate, the cost of one LED device can be reduced and the cost of a display unit using such LED devices can be also reduced. In the method disclosed in the above document, Japanese Patent Laid-open No. Hei 5-315646, LED devices each having a size of 350 m per side are obtained from the sapphire substrate having a diameter of two inches. If LED devices each having a size of several tens m per side are obtained from the sapphire substrate having a diameter of two inches and a display unit is produced by transferring the LED devices on a display panel, it is possible to reduce the cost of a display unit.

However, if the size of each LED device becomes as small as several tens of m per side, it becomes difficult to handle the LED device in the transfer step. Further, since an electrode of each device to be connected to a wiring layer of a base body of a display panel becomes small, the connection work becomes difficult and also a connection failure may often occur.

SUMMARY OF THE INVENTION

An object of the present invention is to provide a device transfer method capable of easily, smoothly separating devices from each other, and facilitating handling of devices in a transfer step and ensuring good electrical connection between the devices and external wiring, although the devices are fine devices, and to provide a panel on which the transferred devices are arrayed.

To achieve the above object, according to a first aspect of the present invention, a device transfer method is provided, the method includes covering a plurality of devices, formed on a substrate, with a layer of resin; the resin layer is then cut, to obtain resin buried devices each of which contains at least one of the devices. The resin buried devices are then peeled from the substrate and transferred to a device transfer body.

With this configuration, the resin buried device being handled has a size larger than the device itself The larger size of the resin buried device facilitates the handling of the devices in the transfer step. Since respective resin buried devices are obtained by cutting only the resin layer without the need of cutting the substrate, it is possible to easily obtain the resin buried devices because the resin layer can be easily, smoothly cut. Further, the substrate, which is not cut, can be reused.

According to a second aspect of the present invention, a device transfer method is provided which includes a step of covering a plurality of devices, which have been formed on a substrate, with a resin layer. Electrodes are formed in the resin layer in a manner such that the electrodes are connected to the devices. The method further includes cutting the resin layer to obtain resin buried devices, each containing at least one of the devices. The resin buried devices are then peeled from the substrate and transferred to a device transfer body.

With this configuration, the resin buried device being handled has a size larger than that of the device itself. The larger size of the resin buried device facilitates the handling of the devices in the transfer step. Since the electrode is formed in the resin layer in such a manner as to be connected to the device, it is possible to easily form the electrode, and to prevent connection failures between the electrode and an external electrode by increasing the area of the electrode. Since respective resin buried devices are obtained by cutting only the resin layer without the need of cutting the substrate, it is possible to easily obtain the resin buried devices because the resin layer can be easily, smoothly cut. Further, the substrate, which is not cut, can be reused.

According to a third aspect of the present invention, a device transfer method is provided which includes the step of covering a plurality of devices, which have been formed on a device formation substrate, with a first resin layer. The method further includes collectively peeling the devices, together with the first resin layer, from the device formation substrate, and transferring them to a first supporting board. Next, the first resin layer is cut on the first supporting board, to make the devices separable from each other. The devices covered with the first resin layer are then peeled from the first supporting board, and transferred to a second supporting board. The devices thus transferred to the second supporting board are then with a second resin layer. Electrodes are formed in the first and second resin layers in such a manner that the electrodes are connected to the devices. The method then involves cutting the second resin layer to obtain resin buried devices each containing at least one of the devices. The resin buried devices are peeled from the second supporting board, and transferred to a device transfer body.

With this configuration, the resin buried device being handled has a size larger than that of the device itself. The larger size of the resin buried device facilitates the handling of the devices in the transfer step. Since the electrode is formed in the first and second resin layers in such a manner as to be connected to the device, it is possible to easily form the electrode and to prevent occurrence of connection failures between the electrode and an external electrode by increasing the area of the electrode. Since respective resin buried devices are obtained by cutting only the first and second resin layers without the need of cutting the substrate, it is possible to easily obtain the resin buried devices because the first and second resin layers can be easily, smoothly cut. Further, the substrate, which is not cut, can be reused.

According to a fourth aspect of the present invention, a panel including an array of resin buried devices is provided. Resin buried device contains at least one device. A plurality of the devices are formed on a substrate and are covered with a resin layer. The resin layer is cut to obtain the resin buried devices each containing at least one of the devices. Furthermore, the resin buried devices are peeled from the substrate and are transferred to the panel.

With this configuration, it is possible to provide an inexpensive panel.

In the above device transfer method, preferably, connection holes are formed in the resin layer in a manner such as to reach the devices by laser beams, and the electrodes are connected to the devices via the connection holes. With this configuration it is possible to prevent the resin layer covering the device from being thinned and hence to improve the strength of the resin buried device.

In the device transfer method, preferably, the electrodes are each formed with their planar dimension substantially corresponding to a planar dimension of each of the resin buried devices, and the resin layer is cut by laser beams with the electrodes taken as a mask, to obtain the resin buried devices. With this configuration, it is possible to eliminate the need of use of a laser system having a high accurate positioning function and hence to reduce the production cost of the devices.

Additional features and advantages of the present invention are described in, and will be apparent from, the following Detailed Description of the Invention and the figures.

BRIEF DESCRIPTION OF THE FIGURES

FIGS. 1A to 1C are sectional views showing steps of a device transfer method according to a first embodiment of the present invention, wherein FIG. 1A shows a state in which a sapphire substrate, on which each device has been formed, is coated with a resin, FIG. 1B shows a state in which the resin is hardened, and FIG. 1C shows a state in which an interface between the device and the sapphire substrate is irradiated with laser beams having come from a back surface side of the sapphire substrate;

FIGS. 2A to 2C are sectional views showing steps continued from the step shown in FIG. 1C, wherein FIG. 2A shows a state in which the device is peeled from the sapphire substrate and is transferred to a first supporting board, FIG. 2B shows a state in which gallium remaining on the device is etched, and FIG. 2C shows a state in which device separation grooves are formed by oxygen plasma;

FIGS. 3A to 3C are sectional views showing steps continued from the step shown in FIG. 2C, wherein FIG. 3A shows a state in which the first supporting board is coated with a resin, FIG. 3B shows a state in which the resin is selectively irradiated with ultraviolet rays and a polyimide layer is selectively irradiated with laser beams, and FIG. 3C shows a state in which the devices are selectively transferred to a second supporting board;

FIGS. 4A to 4C are sectional views showing steps continued from FIG. 3C, wherein FIG. 4A shows a state in which each device is covered with a second resin layer, FIG. 4B shows a state in which the first and second resin layers are etched, and FIG. 4C shows a state in which an electrode connected to the device is formed;

FIGS. 5A to 5C are sectional views showing steps continued from FIG. 4C, wherein FIG. 5A shows a state in which a polyimide layer formed on the second supporting board is irradiated with laser beams, FIG. 5B shows a state in which the devices are transferred to the third supporting board, and FIG. 5C shows a state in which the resin layers are etched;

FIGS. 6A to 6C are sectional views showing steps continued from FIG. 5C, wherein FIG. 6A shows a state in which an electrode connected to each device is formed, FIG. 6B shows a state in which the resin layers are cut by laser beams, and FIG. 6C shows a state in which resin buried devices are peeled from the third supporting board;

FIGS. 7A and 7B are sectional views showing steps continued from FIG. 6C, wherein FIG. 7A shows a state in which each resin buried body is bonded to a device transfer body, and FIG. 7B shows a state in which a resin buried device of another kind is bonded to the same device transfer body;

FIGS. 8A and 8B are sectional views showing steps continued from FIG. 7B, wherein FIG. 8A shows a state in which an interlayer insulating film is formed, and FIG. 8B shows a state in which wiring is formed;

FIGS. 9A to 9D are sectional views showing steps continued from the step shown in FIG. 3C, according to a second embodiment of the present invention, wherein a connection hole is formed in the resin layers by laser beams;

FIGS. 11A and 11B are views showing a light emitting device used in the embodiments of the present invention, wherein FIG. 11A is a sectional view and FIG. 11B is a plan view.

DETAILED DESCRIPTION OF THE INVENTION

Figure 2A:
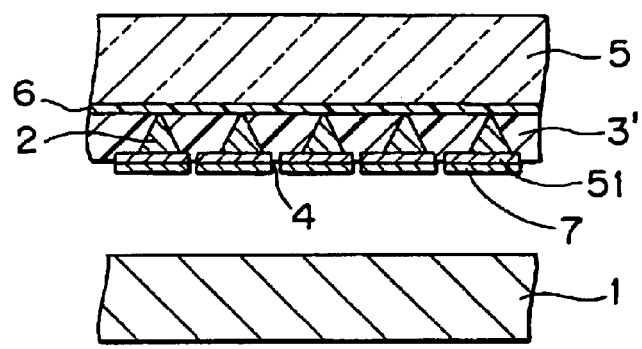

Hereinafter, embodiments of the present invention will be described in detail with reference to the accompanying drawings.

First, there will be described devices used for carrying out the present invention with reference to FIGS. 11A and 11B, which devices are exemplified by light emitting diodes representative of light emitting devices in the following embodiments. FIG. 11A is a sectional view of such a light emitting diode and FIG. 11B is a plan view of the light emitting diode. As shown in these figures, a light emitting diode 2 is made from a gallium nitride (GaN) based semiconductor and is formed by crystal growth on a device formation substrate, for example, a sapphire substrate 1.

An under growth layer 51 made from a GaN based semiconductor is formed on the sapphire substrate 1, and a hexagonal pyramid shaped GaN layer 52 doped with silicon is formed on the under growth layer 51 as follows: namely, an insulating film 53 is formed on the under growth layer 51, and a GaN layer 52 for one device is selectively grown, by an MOCVD (Metal-organic Chemical Vapor Deposition) process, from one of openings formed in the insulating film 53 in such a manner as to be separated from a GaN layer 52 for another device. In the case of taking a C-plane of sapphire as a principal plane of the sapphire substrate 1, the GaN layer 52 becomes a hexagonal pyramid shaped growth layer surrounded by an S-plane, that is, a (1-101) plane 52a.

A portion of the inclined S-plane 52a of the GaN layer 52 functions as a cladding of a double-hetero structure. An InGaN layer 54 is formed as an active layer on the GaN layer 52 in such a manner as to cover the S-plane 52a. A GaN layer 55 doped with magnesium is formed on the InGaN layer 54. The GaN layer 55 functions as a cladding.

A metal material such as Ni, Pt, Au, or Pb is vapor-deposited on the GaN layer 55, to form a p-electrode 56. An n-electrode will be formed on a back surface side of the under growth layer 51 during a transfer step to be described later.

The above described light emitting diode 2 is configured, for example, as a light emitting diode of blue (B). The structure of the light emitting diode 2 is not limited to that described above but may be a structure in which an active layer is formed into a flat plate or band shape, or be a pyramid structure with a C-plane formed on its upper end portion. The material of the light emitting diode 2 is not limited to a GaN based material, either, but may be any other nitride based material or any other compound semiconductor.

A device transfer method according to a first embodiment of the present invention will be described below with reference to FIGS. 1 to 8. The light emitting diodes 2 shown in FIGS. 11A and 11B are used as devices to be transferred by the device transfer method according to the first embodiment.

Referring to FIG. 1A, a plurality of light emitting diodes 2, each having the same structure as that shown in FIGS. 11A and 11B, are densely formed on a principal plane of a sapphire substrate 1 having a diameter of, for example, two inches in such a manner as to be arrayed in rows and columns, that is, into a matrix. Each light emitting diode 2 has a size about 20 m square. The light emitting diodes 2 are in a state being separable from each other by device separation grooves 4 formed by reactive ion etching or the like.

The sapphire substrate 1 is coated with an ultraviolet curing type resin 3, and a polyimide layer 6 formed on a surface of a quartz glass board 5 as a first supporting board is brought into press-contact with the ultraviolet curing type resin 3.

Referring to FIG. 1B, the ultraviolet curing type resin 3 is irradiated with ultraviolet rays having come from a back surface side of the quartz glass board 5 side, to be hardened, whereby a first resin layer 3' is formed. The light emitting diodes 2 are thus collectively covered with the first resin layer 3'.

Referring to FIG. 1C, interfaces between the GaN based under growth layers 51 of the light emitting diodes 2 and the sapphire substrate 1 are irradiated with laser beams having come from a back surface side of the sapphire substrate 1. At this time, GaN at each interface is decomposed into nitrogen and gallium and the gaseous nitrogen is released therefrom, so that the bond of each light emitting diode 2 to the sapphire substrate 1 is released. Consequently, as shown in FIG. 2A, the light emitting diodes 2 are collectively peeled from the sapphire substrate 1. With respect to the first resin layer 3' covering the light emitting diodes 2, bonds of molecules constituting the resin layer 3' are cut at the interfaces by the same laser abrasion effect. As a result, the resin layer 3' is peeled, together with the light emitting diodes 2, from the sapphire substrate 1.

Figure 2B:
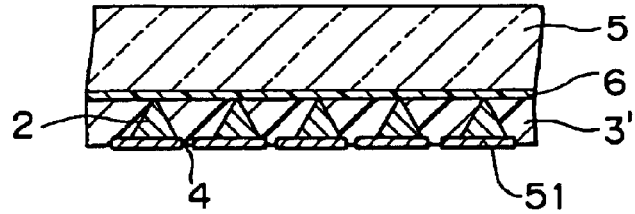

As shown in FIG. 2A, only gallium (Ga) 7 remains on the peeling surface on the light emitting diode 2 side, which gallium is then removed by wet etching or the like as shown in FIG. 2B.

Figure 2C:
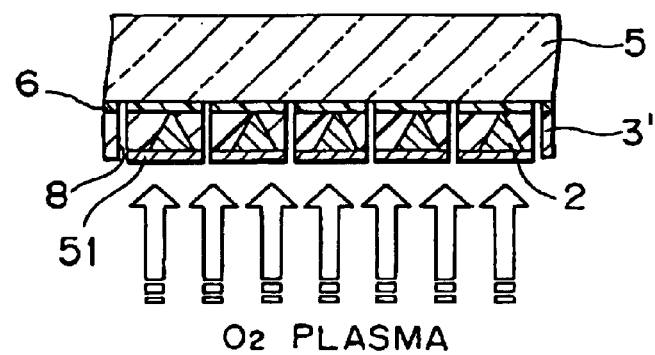

Referring to FIG. 2C, device separation grooves 8, each extending from the device separation groove 4 to the quartz glass board 5, are formed by etching the first resin layer 3' by using oxygen plasma. The formation of the device separation grooves 8 makes the light emitting diodes 2 separable from each other. In this plasma etching, since an erosion effect of oxygen plasma to the under growth layer 51 is significantly smaller than that to the first resin layer 3', the device separation grooves 8 are formed with the under growth layer 51 taken as a mask.

Figure 3A:
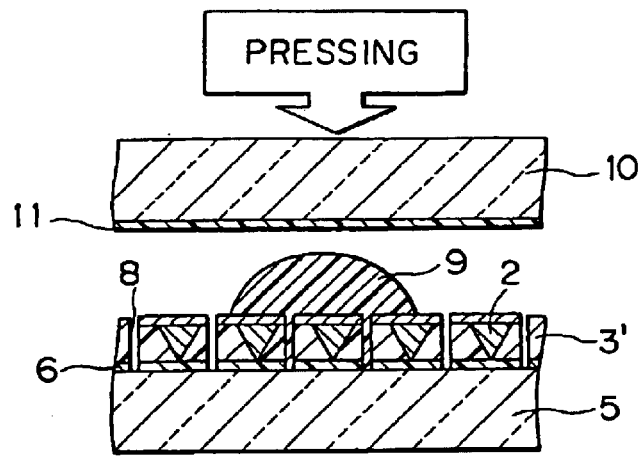

Referring to FIG. 3A, the light emitting diodes 2 covered with the first resin layer 3' are coated with an ultraviolet curing type resin 9, and a polyimide layer 11 formed on a surface of a quartz glass board 10 as a second supporting board is brought into press-contact with the ultraviolet curing type resin 9.

Figure 3B:
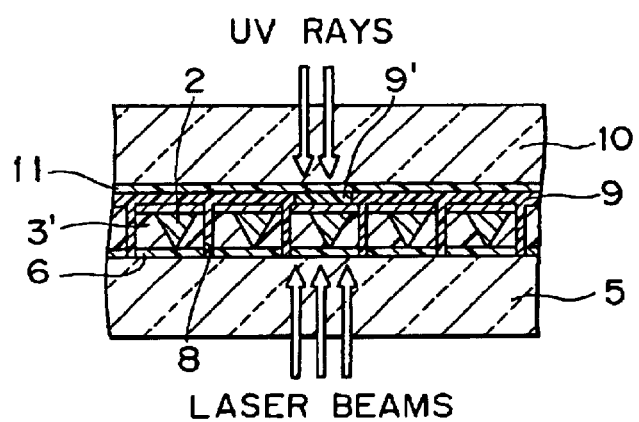

Referring to FIG. 3B, the ultraviolet curing type resin 9 is selectively irradiated with ultraviolet rays having come from a back surface of the quartz glass board 10. It is to be noted that only one position of the ultraviolet curing type resin 9, which corresponds to a position of the central light emitting diode 2, is irradiated with ultraviolet rays in FIG. 3B; however, in actual, positions of the ultraviolet curing type resin 9, which correspond to positions of the light emitting diodes 2 spaced from each other at intervals of, for example, ten pieces, are selectively irradiated with ultraviolet rays. The portion, irradiated with ultraviolet rays, of the ultraviolet curing type resin 9 is hardened, whereby a resin layer 9', which bonds the light emitting diode 2 covered with the first resin layer 3' to the polyimide layer 11 formed on the quartz glass board 10, is formed.

Figure 3C:
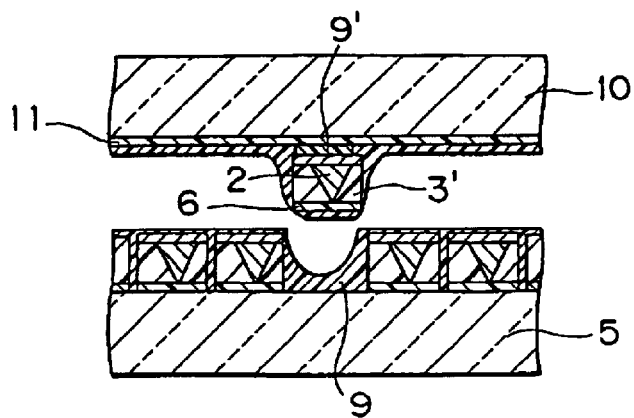

An interface between the polyimide layer 6 and the quartz glass board 5 is irradiated with laser beams having come from a back surface side of the quartz glass board 5. At this time, the polyimide layer 6 is peeled from the quartz glass board 5 or internally peeled by the laser abrasion effect. In this way, as shown in FIG. 3C, although the light emitting diodes 2, each having the size of about 20 m square, are densely arrayed on the quartz glass board 5 as the first supporting board, those spaced from each other at the intervals of ten pieces are transferred to the quartz glass board 10 as the second supporting board while being arrayed with an enlarged pitch of about 200 m. It is to be noted that only one light emitting diode 2 is shown in FIG. 3C; however, in actual, the light emitting diodes 2 covered with the first resin layer 3' on the quartz glass board 5, which are spaced from each other at the intervals of 10 pieces, are simultaneously transferred to the quartz glass substrate 10. In addition, the light emitting diodes 2, which are adjacent to those having been transferred, remain on the quartz glass substrate 5; however, they will be all transferred to other quartz glass boards 10.

Referring to FIG. 4A, all of the light emitting diodes 2 (covered with the first resin layer 3') having been transferred to the quartz glass substrate 10 are collectively covered with a second resin layer 12. The second resin layer 12 is formed, for example, by hardening an ultraviolet curing type resin by ultraviolet rays.

As shown in FIG. 4B, the second resin layer 12, the polyimide layer 6, and the first resin layer 3' are etched back by using oxygen plasma, to expose the p-electrode 56 of the light emitting diode 2, and then the surfaces of the p-electrode 56 and the first and second resin layers 3' and 12, on which an extraction electrode to be described later is to be formed, are cleaned.

Referring to FIG. 4C, an extraction electrode 13 is formed on the first and second resin layers 3' and 12 in such a manner as to be connected to the p-electrode 56 of the light emitting diode 2. The extraction electrode 13 is formed by depositing a transparent material made from a metal or ITO (Indium Tin Oxide) by vapor-deposition or sputtering and patterning the deposited material into a specific planar shape having a specific size by photolithography and wet etching.

Referring to FIG. 5A, a quartz glass board 14 as a third supporting board is fixed to a surface side, on which the extraction electrode 13 has been formed, of the second resin layer 12 via a polyimide layer 15 formed on a surface of the quartz glass board 14. An interface between the polyimide layer 11 and the quartz glass board 10 is irradiated with laser beams having come from a back surface side of the quartz glass board 10, so that the polyimide layer 11 is peeled from the quartz glass board 10 or internally peeled by the laser abrasion effect (see FIG. 5B). In this way, the light emitting diodes 2 on the quartz glass board 10 as the second supporting board are collectively transferred, together with the resin layers 3' and 12 covering the light emitting diodes 2, to the quartz glass board 14 as the third supporting board. As will be described below, this transfer step is carried out for forming an extraction electrode on the n-electrode side opposite to the extraction electrode 13 on the p-electrode side.

Referring to FIG. 5C, the polyimide layer 11 and the second resin layer 12 are etched back by oxygen plasma, to expose the under growth layer 51 of the light emitting diode 2, and then surfaces of the under growth layer 51 and the second resin layer 12, on which an extraction electrode on the n-electrode side is to be formed as described below, are cleaned.

Referring to FIG. 6A, an extraction electrode 16 is formed on the second resin layer 12 in such a manner as to be connected to the under growth layer 51 of the light emitting diode 2. The extraction electrode 16 is formed by depositing a transparent material such a metal or ITO by vapor-deposition or sputtering and patterning the deposited material into a specific planar shape having a specific size by lithography and wet etching.

Referring to FIG. 6B, device separation grooves 17 are formed by cutting the second resin layer 12 and the polyimide layer 15 by laser beams L emitted from an excimer laser system or a third harmonic YAG laser system, to obtain each resin buried device 20 in which the light emitting diode 2 is covered with the resin layer. In accordance with this embodiment, each resin buried device 20 containing one light emitting diode 2 has a planar size of about 160 m square and has a thickness of several tens m.

Referring to FIG. 6C, an interface between the quartz glass board 14 and the polyimide layer 15 is irradiated with laser beams having come from a back surface of the quartz glass board 14. It is to be noted that only one resin buried device 20 is irradiated with laser beams in FIG. 6C; however, in actual, the resin buried devices 20 spaced from each other at intervals of, for example, three pieces are selectively irradiated with laser beams, and portions, irradiated with laser beams, of the polyimide layer 15 are peeled from the interface with the quartz glass board 14 or internally peeled by the laser abrasion effect.

Figure 7A:
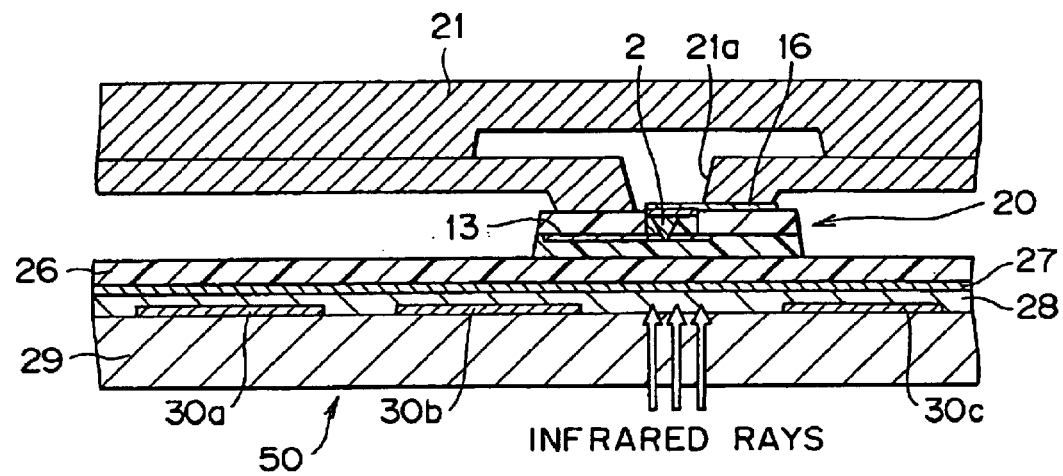

The resin buried device 20 is then attracted by a vacuum chuck 21 having a suction hole 21a, and is transferred, as shown in FIG. 7A, to a panel 50 of a display unit as a device transfer body. The suction holes 21a are arrayed in rows and columns with pitches corresponding to those of pixels of a display unit, that is, arrayed into a matrix corresponding to that of the pixels, to collectively attract the peeled resin buried devices 20 spaced from each other at the intervals of three pieces from the quartz glass board 14. Concretely, the suction holes 21a are arrayed into a matrix with a pitch of 600 m, which can simultaneously attract about 300 pieces of the resin buried devices 20.

That is to say, of the resin buried devices 20 arrayed with a pitch of about 200 m on the quartz glass board 14 as the third supporting board, those spaced from each other at the intervals of three pieces are transferred to the device transfer body or panel 50 in such a manner as to be arrayed with an enlarged pitch of about 600 m. It is to be noted that the other resin buried devices 20 remaining on the quartz glass board 14 will be all transferred to other positions of the same device transfer body 50 or other device transferred bodies.

The device transfer body 50 includes an insulating substrate 29, wiring layers 30a to 30c, an insulating layer 28 formed on the insulating substrate 29 in such a manner as to cover the wiring layers 30a to 30c, a wiring layer 27 formed on the insulating layer 28, and a thermoplastic resin layer 26 formed on the wiring layer 27. The resin buried device 20 is brought into press-contact with the thermoplastic resin layer 26. A portion, being in press-contact with the resin buried device 20, of the thermoplastic resin layer 26 is softened by irradiating it with infrared rays having come from a back surface side of the insulating substrate 29, whereby the resin buried device 20 is fixed to the thermoplastic resin layer 26.

Figure 7B:
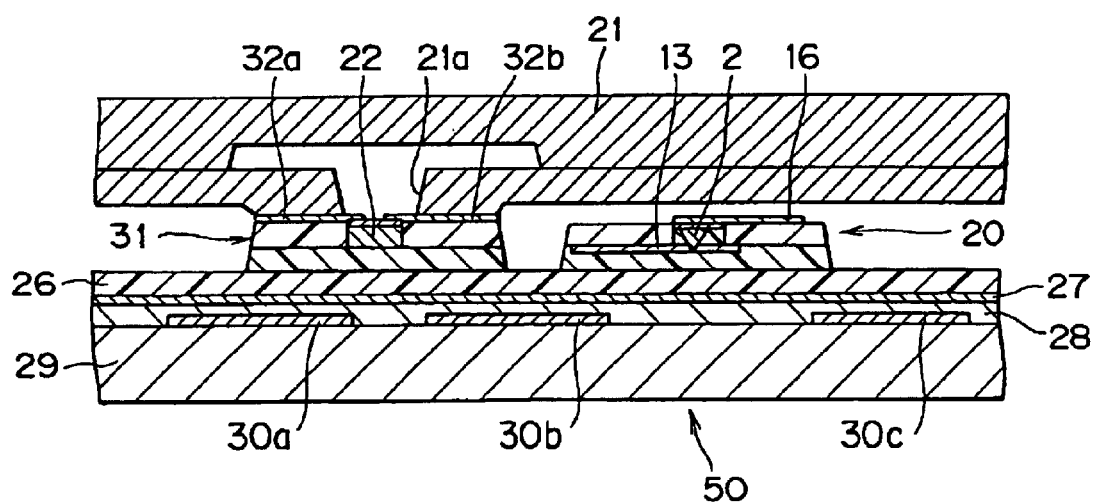

After that, as shown in FIG. 7B, resin buried devices 31 containing, for example, light emitting diodes 22 of red (R) are transferred, in accordance with the same manner as that described above, to the device transfer body 50 in such a manner as to be arrayed in a matrix with a pitch of about 600 m. Subsequently, while not shown, resin buried devices containing light emitting diodes of green (G), control transistors, and the like are similarly transferred to the device transfer body 50.

Figure 8A:
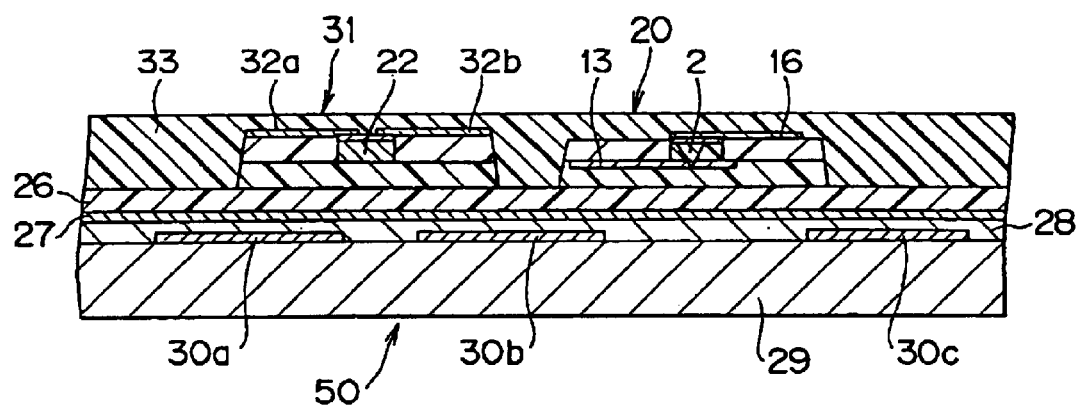
Figure 8B:
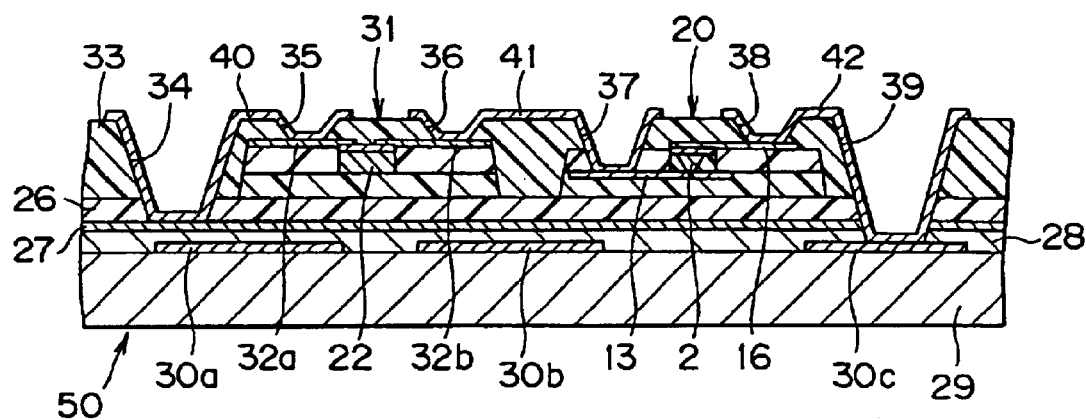

Referring to FIG. 8A, an insulating resin layer 33 is formed in such a manner as to cover the resin buried devices, the control transistors, and the like. Then, as shown in FIG. 8B, connection holes 34, 35, 36, 37, 38, and 39 are formed in the insulating resin layer 33. By use of these connection holes, an extraction electrode 32a of the resin buried device 31 is connected to the wiring layer 27 by means of wiring 40; an extraction electrode 32b, formed on the same surface side as that on which the extraction electrode 32a is formed, of the resin buried device 31 is connected to the extraction electrode 13 of the resin buried device 20 by means of wiring 41; and the extraction electrode 16 of the resin buried device 20 is connected to the wiring layer 30c by means of wiring 42. A protective layer and the like are finally formed, to obtain a display panel in which the light emitting diodes of red (R), green (G), and blue (B) covered with the resin are arrayed in rows and columns with pitches corresponding to pixel pitches, that is, arrayed into a matrix corresponding to that of pixels.

As described above, according to this embodiment, since the light emitting diodes 2, each having the very small size about 20 m square, are densely formed on the sapphire substrate 1 as the device formation substrate, the number of the light emitting diodes 2 per one substrate can be made large. This makes it possible to reduce the product cost of one light emitting diode and hence to reduce the cost of a display unit using the light emitting diodes. Since the light emitting diode is transferred to the device transfer body 50 in the form of the resin buried device having the size about 160 m square, it is possible to easily handle the light emitting diodes in the transfer step. The resin layer covering the light emitting diode 2 serves to protect the light emitting diode. The enlargement of the size of the light emitting diode 2 by covering the diode 2 with the resin layer is advantageous in that the extraction electrodes 13 and 16 can be easily formed, and that the planar sizes of the extraction electrodes 13 and 16 can be enlarged enough to prevent occurrence of any wiring failure at the time of wiring the extraction electrodes 13 and 16 to the device transfer body 50 side, to improve the reliability of wiring thereof to the device transfer body 50 side.

In the above embodiment, in place of cutting the hard sapphire substrate 1, the first and second resin layers 3 and 12 are cut by laser beams, to separate an array of the light emitting diodes 2 into individual devices to be transferred (resin buried devices). With this configuration, since the resin layer can be easily and accurately cut by the laser abrasion effect, it is possible to separate an array of the light emitting diodes 2 into individual devices having accurate shapes and sizes without a lot of labor and time paid for cutting.

A second embodiment of the present invention will be described with reference to FIGS. 9A to 9D. It is to be noted that parts corresponding to those described in the first embodiment are designated by the same reference numerals and the overlapped description thereof is omitted.

FIG. 9A shows a step equivalent to the step shown in FIG. 4A according to the first embodiment. According to this embodiment, however, the process goes on from the step shown in FIG. 9A to a step shown in FIG. 9B, in which the second resin layer 12, the polyimide layer 6 and the first resin layer 3' are etched back by oxygen plasma to an extent that the p-electrode 56 of the light emitting diode 2 is not exposed, and then the surfaces of the first and second resin layers 3' and 12, on which an extraction electrode to be described later is to be formed, are cleaned.

Referring to FIG. 9C, a connection hole 23 is formed in the first resin layer 3' by laser beams emitted by an excimer laser system or a third harmonic YAG laser system, to expose the p-electrode 56 of the light emitting diode 2. Referring to FIG. 9D, an extraction electrode 13' is formed on the first and second resin layers 3' and 12 in such a manner as to be connected to the p-electrode 56 via the connection hole 23. The material of the extraction electrode 13' and the formation method thereof are the same as those described in the first embodiment. Subsequent steps are also the same as those described in the first embodiment.

According to the first embodiment, as shown in FIG. 4B, the first and second resin layers 3' and 12 are etched back until the p-electrode 56 is exposed, and correspondingly, the thicknesses of the first and second resin layers 3' and 12 for covering and protecting the light emitting diode 2 become thin, so that the rigidity of the resin buried device 20 obtained in the subsequent step becomes weak. This may often cause a difficulty in handling the resin buried device 20 at the time of picking up the resin buried device 20 by the vacuum chuck 21 for transferring it to the device transfer body 50.

To cope with such an inconvenience, according to the second embodiment, as described above, the connection hole 23 for exposing the p-electrode 56 therethrough is locally formed in the first and second resin layers 3' and 12, with a result that as compared with the first embodiment, the thickness of the first and second resin layers 3' and 12 become thicker and thereby the strengths thereof become larger. Another advantage of formation of the connection hole 23 is as follows. Since an etching rate of the ultraviolet curing resin forming each of the first and second resin layers 3' and 12 by oxygen plasma is small, it takes a lot of time to etch back the first and second resin layers 3' and 12. Meanwhile, the use of laser beams can form the connection hole in a resin layer for a short time irrespective of a material forming the resin layer. Accordingly, as compared with the manner in the first embodiment that the first and second resin layers 3' and 12 are etched back by oxygen plasma until the p-electrode 56 is exposed, the manner in the second embodiment that the first and second resin layers 3' and 12 are etched back by oxygen plasma to an extent that the p-electrode 56 is not exposed and then the connection hole 23 is formed in the first and second resin layers 3' and 12 by laser beams so as to expose the p-electrode 56 therethrough is advantageous in that the time required to expose the p-electrode 56 can be shorten, and that the degree of freedom in selection of materials for forming the first and second resin layers 3' and 12 can be increased, leading to the reduced material cost.

It to be noted that the step shown in FIG. 9B may be replaced with a step in which the connection hole 23 is directly formed in the second resin layer 12, the polyimide layer 6, and the first resin layer 3' in the state shown in FIG. 9A. However, the cleaning of the surfaces, on which the extraction electrode 13' is to be formed, by oxygen plasma as in the step shown in FIG. 9B is advantageous in increasing the adhesive strength of the extraction electrode 13' to the resin layers.

A third embodiment of the present invention will be described below with reference to FIGS. 10A and 10B. It is to be noted that parts corresponding to those described in the first embodiment are designated by the same reference numerals and the overlapped description thereof is omitted.

Figure 10A:
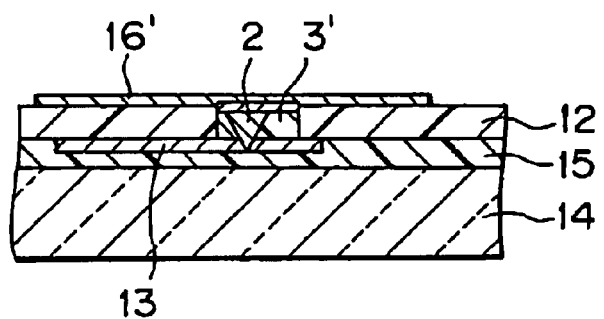
FIGS. 10A and 10B are sectional views showing steps continued from the step shown in FIG. 5C, according to a third embodiment, wherein the resin layers are cut by laser means with the electrode taken as a mask.

According to the third embodiment, the process goes on from the step shown in FIG. 5C in the first embodiment to a step shown in FIG. 10A, in which an extraction electrode 16' to be connected to the under growth layer 51 of the light emitting diode 2 is formed on the second resin layer 12, wherein a planar size of the extraction electrode 16' is set to be equal to that of a resin buried device 20' obtained in the next step, that is, set to a square shape having a size 160 m square. Like the first embodiment, the extraction electrode 16' is formed by depositing a transparent material such as a metal or ITO by sputtering and patterning the deposited material into a planar shape having the above-described specific size by photolithography and wet etching.

Figure 10B:
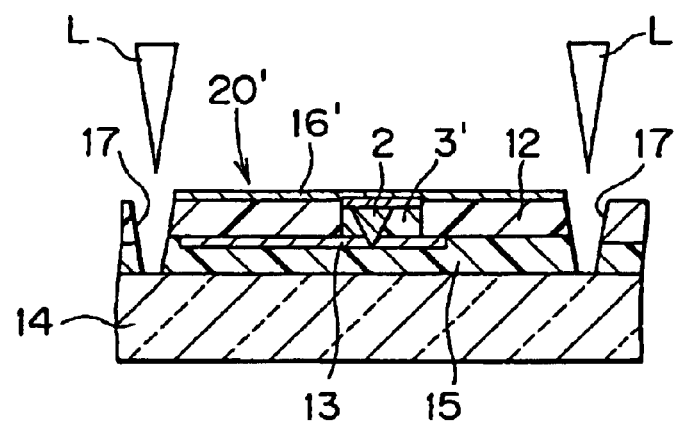
Figure 12:
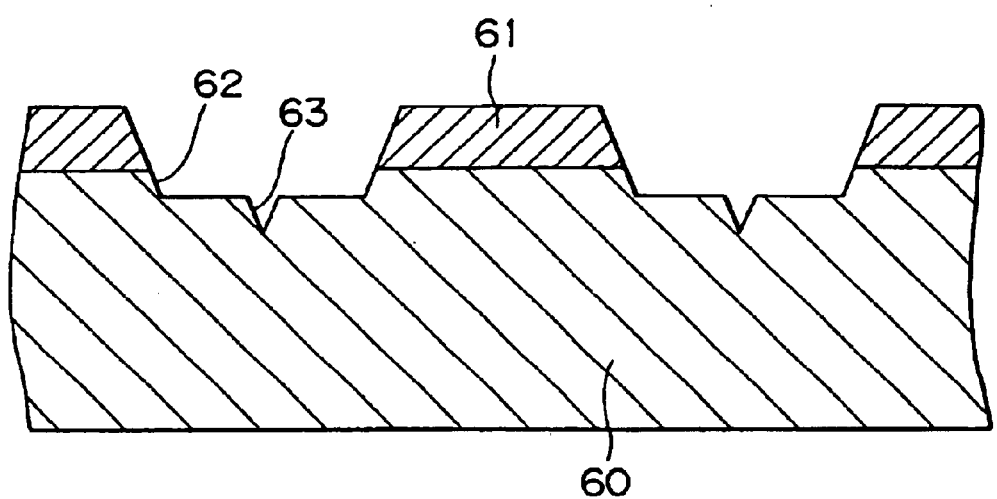
FIG. 12 is a sectional view showing a related art method of cutting a gallium nitride based semiconductor wafer.

In the next step shown in FIG. 10B, device separation grooves 17 are formed by cutting the second resin layer 12 and the polyimide layer 15 by laser beams L emitted from an excimer laser system or a third harmonic YAG laser system with the extraction electrode 16' taken as a mask, to obtain each resin buried device 20' in which the light emitting diode 2 is covered with the resin layer. Subsequent steps are the same as those described in the first embodiment.

In the step shown in FIG. 6B according to the first embodiment, the device separation grooves 17 are formed by identifying alignment marks formed, for example, at diagonal positions on the laser system side and performing accurate NC control of the laser system on the basis of the identified alignment marks. In this case, the laser system side must be operated at a high positioning accuracy in the order of 1 m. On the contrary, according to the third embodiment, since the extraction electrode 16' formed so as to have the same planar shape and planar size as those of the resin buried device 20' to be separated is used as the mask, the laser system side does not require a high positioning accuracy and a cross-sectional diameter of a laser beam may be relatively large. For example, the laser system side may be operated at a positioning accuracy in the order of 10 m. According to this embodiment, therefore, it is possible to eliminate the need of use of an expensive, accurate laser system and hence to reduce the production cost. Further, the third embodiment can be carried out without addition of any step to the first embodiment.

While the embodiments of the present invention have been described, the present invention is not limited thereto, and it is to be understood that many changes may be made without departing from the technical thought of the present invention.

The device used for carrying out the present invention is not limited to the light emitting diode described in the embodiments, but may be a laser diode, a thin film transistor device, an photoelectric conversion device, a piezoelectric device, a resistance device, a switching device, a micromagnetic device, or a micro-optical device.

In the light emitting diode described in the embodiments of the present invention, the substrate, on which a crystal growth layer is to be grown, is not particularly limited insofar as an active layer having good crystallinity can be formed thereon. Examples of materials for forming the substrates may include sapphire ($Al_2O_3$; containing an A-plane, R-plane, and C-plane), SiC (including 6H, 4H, and 3C), GaN, Si, ZnS, ZnO, AlN, LiMgO, GaAs, $MgAl_2O_4$, and InAlGaN. The above material having a hexagonal or cubic system is preferably used, and a substrate made from the above material having a hexagonal system is more preferably used. For example, in the case of using a sapphire substrate, the C-plane of sapphire, which has been often used for growing a gallium nitride (GaN) based compound semiconductor thereon, may be used as a principal plane of the substrate. The C-plane as the principal plane of the substrate may contain a plane orientation tilted in a range of 5 to 6°. The substrate may not be contained in a light emitting device as a final product. For example, the substrate may be used for holding a device portion in the course of production and be removed before accomplishment of the device.

In the light emitting diode described in the embodiments of the present invention, the crystal growth layer formed by selective growth on the substrate preferably has a crystal plane tilted to the principal plane of the substrate. The crystal growth layer may be a material layer containing a light emission region composed of a first conductive layer, an active layer, and a second conductive layer. In particular, the crystal growth layer, preferably and thereby not limited thereto, has a wurtzite crystal structure. Such a crystal layer can be made from, for example, a group III based compound semiconductor, a BeMgZnCdS based compound semiconductor, a BeMgZnCdO based compound semiconductor, a gallium nitride based compound semiconductor, an aluminum nitride (AlN) based compound semiconductor, indium nitride (InN) based compound semiconductor, an indium gallium nitride (InGaN) based compound semiconductor, or aluminum gallium nitride (AlGaN) based compound semiconductor. In particular, a nitride based semiconductor such as a gallium nitride based compound semiconductor is preferably used as the material for forming the above crystal layer. It is to be noted that InGaN or AlGaN, or GaN does not necessarily mean only a nitride based semiconductor of ternary mixed crystal or binary mixed, but may be a nitride based semiconductor containing other impurities in amounts not to affect the nitride based semiconductor. For example, InGaN may contain Al and another impurity in slight amounts not to affect InGaN.

In the light emitting diode described in the embodiments, the peeling layer to be interposed between the substrate and the device is made from polyimide; however, it may be made from another resin, particularly, a high molecular resin. Examples of the high molecular resins may include polyacetylene, polyamide, polyether sulphone, polycarbonate, polyethylene, polyethyleneterephthalate, polymethyl methacrylate, polystyrene, polyvinyl chloride, polyester, polyether, epoxy resin, polyolefin, and polyacrylate. These materials may be used singly or in combination of two or more kinds.

Although each of the first and second resin layers 3' and 12 is made from an ultraviolet curing type resin in the embodiments, it may be made from a thermoplastic resin or a thermosetting resin. The use of an ultraviolet curing type resin, however, is advantageous in that since an ultraviolet curing type resin does not require any heat at the hardening stage, it is not thermally contracted or expanded. As a result, the device is not affected by a stress caused by hardening the resins forming the first and second resin layers 3' and 12, and can be produced at a high dimensional accuracy.

Each of the first, second, and third supporting boards 5, 10 and 14 is not limited to the quartz glass board described in the embodiments, but may be a board of another type, for example, a plastic board.

The transfer of the resin buried devices 20 to the device transfer body 50 may be performed in accordance with a manner different from that described in the embodiment. Specifically, the resin buried devices 20 may be individually peeled from the third supporting board 14 once, and then transferred to the device transfer body 50 one by one.

It is to be noted that the third embodiment may be combined with the second embodiment.

While a preferred embodiment of the present invention has been described using specific terms, such description is for illustrative purposes only, and it is to be understood that changes and variations may be made without departing from the spirit or scope of the following claims.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A device transfer method comprising the steps of:

covering a plurality of devices formed on a device formation substrate with a first resin layer;

collectively peeling said devices together with said first resin layer from said device formation substrate, and transferring them to a first supporting board;

cutting said first resin layer on said first supporting board, to make said devices separable from each other;

peeling said devices covered with said first resin layer from said first supporting board, and transferring them to a second supporting board;

covering said devices thus transferred to said second supporting board with a second resin layer;

forming electrodes in said first and second resin layers in such a manner that said electrodes are connected to said devices;

cutting said second resin layer, to obtain resin buried devices each containing at least one of said devices; and peeling said resin buried devices from said second supporting board, and transferring them to a device transfer body.

2. A device transfer method according to claim 1, wherein a plurality of said devices covered with said first resin layer are selectively, simultaneously peeled from said first supporting board, and are transferred to said second supporting board with a pitch larger than an array pitch of said devices on said first supporting board; and a plurality of said resin buried devices are selectively, simultaneously peeled from said second supporting board, and are transferred to said device transfer body with a pitch larger than an array pitch of said resin buried devices on said second supporting board.

3. A device transfer method according to claim 2, wherein said devices covered with said first resin layer are selectively peeled from said first supporting board by selectively irradiating interfaces between said first supporting board and said devices covered with said first resin layer with laser beams directed from said first supporting board side; and said resin buried devices are selectively peeled from said second supporting board by selectively irradiating interfaces between said second supporting board and said resin buried devices with laser beams having come from said second supporting board side.

4. A device transfer method according to claim 3, wherein a polyimide layer is interposed between said first supporting board and said devices covered with said first resin layer, and a polyimide layer is interposed between said second supporting board and said resin buried devices.

5. A device transfer method according to claim 1, wherein said devices are light emitting devices;

said device transfer body has a wiring layer; and said electrodes are formed in said resin layer in a manner such that said electrodes are connected to said light emitting devices and wherein said resin layer is cut to form said resin buried devices, and said resin buried devices are transferred to said device transfer body in a manner such that said electrodes are connected to said wiring layer and said resin buried devices are arrayed in rows and columns.

6. A device transfer method according to claim 1, wherein connection holes are formed in said first and second resin layers in a manner to reach said devices by laser beams, and said electrodes are connected to said devices via said connection holes.

7. A device transfer method according to claim 1, wherein said electrodes are each formed with a planar dimension substantially corresponding to a planar dimension of each of said resin buried devices, and said second resin layer is cut by laser beams with said electrodes taken as a mask, to obtain said resin buried devices.

8. A device transfer method according to claim 1, wherein said devices are light emitting devices obtained by growing a crystal of a gallium nitride based semiconductor on said device formation substrate;

said device formation substrate has a light transmissive characteristic; and interfaces between said device formation substrate and said light emitting devices are irradiated with laser beams directed from said device formation substrate side, and said light emitting devices are peeled from said device formation substrate by decomposition of said gallium nitride based semiconductor at said interfaces into nitrogen and gallium.

* * * * *